United States Patent
Nakayama et al.

(10) Patent No.: US 9,670,578 B2
(45) Date of Patent: *Jun. 6, 2017

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Tokuyuki Nakayama, Ome (JP);
Eiichiro Nishimura, Ome (JP);
Fumihiko Matsumura, Ome (JP);
Masashi Iwara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/117,531

(22) PCT Filed: Feb. 12, 2015

(86) PCT No.: PCT/JP2015/053849
§ 371 (c)(1),
(2) Date: Aug. 9, 2016

(87) PCT Pub. No.: WO2015/129469
PCT Pub. Date: Sep. 3, 2015

(65) Prior Publication Data
US 2016/0348230 A1  Dec. 1, 2016

(30) Foreign Application Priority Data

Feb. 27, 2014 (JP) ................................. 2014-037022
Aug. 8, 2014 (JP) ................................. 2014-163148
Dec. 25, 2014 (JP) ................................. 2014-263622

(51) Int. Cl.
| | |
|---|---|
| C04B 35/453 | (2006.01) |
| H01B 1/02 | (2006.01) |
| C23C 14/34 | (2006.01) |
| H01L 21/02 | (2006.01) |
| C04B 35/01 | (2006.01) |
| C23C 14/08 | (2006.01) |
| C23C 14/58 | (2006.01) |

(52) U.S. Cl.
CPC .......... *C23C 14/3414* (2013.01); *C04B 35/01* (2013.01); *C04B 35/453* (2013.01); *C23C 14/08* (2013.01); *C23C 14/086* (2013.01); *C23C 14/5853* (2013.01); *H01L 21/02554* (2013.01); *H01L 21/02565* (2013.01); *H01L 21/02631* (2013.01); *C04B 2235/3284* (2013.01); *C04B 2235/3286* (2013.01); *C04B 2235/656* (2013.01); *C04B 2235/76* (2013.01); *C04B 2235/77* (2013.01); *C04B 2235/80* (2013.01)

(58) Field of Classification Search
CPC ................................ C04B 35/453; H01B 1/02
USPC .................................. 252/519.51, 519.1, 500
See application file for complete search history.

(56) References Cited

U.S. PATENT DOCUMENTS

| | | | | |
|---|---|---|---|---|
| 8,598,578 B2 * | 12/2013 | Yano | ..................... | C01G 15/006 |
| | | | | 204/192.15 |
| 8,641,932 B2 * | 2/2014 | Yano | ..................... | C04B 35/453 |
| | | | | 204/192.15 |
| 8,647,537 B2 * | 2/2014 | Utsuno | ................... | C04B 35/01 |
| | | | | 252/518.1 |
| 2011/0168994 A1 | 7/2011 | Kawashima | | |
| 2011/0180763 A1 | 7/2011 | Utsuno | | |
| 2012/0012838 A1 | 1/2012 | Hosono | | |
| 2012/0068130 A1 * | 3/2012 | Inoue | .................... | C23C 14/086 |
| | | | | 252/519.51 |
| 2013/0285053 A1 | 10/2013 | Kawashima | | |
| 2014/0145124 A1 | 5/2014 | Sunagawa | | |

FOREIGN PATENT DOCUMENTS

| | | |
|---|---|---|
| JP | 2007-73312 A1 | 3/2007 |
| JP | 2010-219538 A1 | 9/2010 |
| JP | 2011-252231 A1 | 12/2011 |
| JP | 2013-1590 A1 | 1/2013 |
| JP | 2013-100224 A1 | 5/2013 |
| JP | 2014-95144 A1 | 5/2014 |
| TW | 201402852 A | 1/2014 |

(Continued)

OTHER PUBLICATIONS

U.S. Appl. No. 15/117,529 by Tokuyuki Nakayama, et al., filed Aug. 9, 2016 (40 Pages).
Office Action issued to TW Application No. 104105274, mailed Feb. 24, 2016 (5 Sheets).
Office Action issued to TW Application No. 104105273, mailed Dec. 17, 2015 (5 Sheets).

(Continued)

*Primary Examiner* — Douglas McGinty
(74) *Attorney, Agent, or Firm* — Kratz, Quintos & Hanson, LLP

(57) ABSTRACT

An oxide sintered body which, when made into an oxide semiconductor thin film by sputtering, can achieve low carrier density and high carrier mobility, and a sputtering target using said oxide sintered body are provided. This oxide sintered body contains indium, gallium and zinc as oxides. The gallium content is 0.08 or more and less than 0.20 in terms of Ga/(In+Ga) atomic ratio, and the zinc content is 0.0001 or more and less than 0.08 in terms of Zn/(In+Ga+Zn) atomic ratio. This crystalline oxide semiconductor thin film is formed with the oxide sintered body as a sputtering target, and can achieve a carrier density of $8.0 \times 10^{17}$ cm$^{-3}$ or less and a carrier mobility of 10 cm$^2$/V·s or greater.

10 Claims, No Drawings

(56) References Cited

FOREIGN PATENT DOCUMENTS

| WO | 2009/148154 A1 | 12/2009 |
| WO | 2010/032422 A1 | 3/2010 |
| WO | 2012/153491 A1 | 11/2012 |

OTHER PUBLICATIONS

A. Takagi, et al.; "Carrier transport and electronic structure in amorphous oxide semiconductor, a In—GaZnO4;" Thin Solid Films; vol. 486; 2005; pp. 38-41 (4 Sheets).
International Search Report for International Application No. PCT/JP2015/053849 dated Apr. 28, 2015.

* cited by examiner

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to a sputtering target that achieves reduced carrier density of a crystalline oxide semiconductor thin film when the sputtering target contains zinc, a zinc-containing oxide sintered body most suitable for obtaining the sputtering target, and a zinc-containing crystalline oxide semiconductor thin film that is obtained by using the sputtering target and has low carrier density and high carrier mobility.

BACKGROUND ART

Thin film transistors (TFTs) are a type of field effect transistors (hereinafter referred to as FETs). TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material. MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of electrons or holes is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor deposition and containing elements of In, Ga, Zn, and O. The composition of the oxide is $InGaO_3(ZnO)_m$ (m is a natural number less than 6) when the oxide is crystallized. The transparent semi-insulating amorphous oxide thin film is a semi-insulating thin film having a carrier mobility (also referred to as carrier electron mobility) of more than 1 $cm^2/(V \cdot sec)$ and a carrier density (also referred to as carrier electron density) of $10^{16}/cm^3$ or less without doping with an impurity ion. Patent Document 1 also proposes a thin film transistor in which the transparent semi-insulating amorphous oxide thin film is used as a channel layer.

However, as proposed in Patent Document 1, the transparent amorphous oxide thin film (a-IGZO film) containing elements of In, Ga, Zn, and O and deposited by any method of vapor deposition selected from sputtering and pulsed laser deposition has an electron carrier mobility in the range of about from 1 to 10 $cm^2/(V \cdot sec)$, which is relatively high. However, oxygen defects are likely to be generated in the amorphous oxide thin film, and electron carriers do not always stably behave in response to external factors such as heat. It has been pointed out that these facts often have adverse effects and cause problems associated with instability of devices, such as TFTs, when the devices are formed.

Regarding materials for solving these problems, Patent Document 2 proposes a thin film transistor including an oxide thin film in which gallium is dissolved in indium oxide. In the oxide thin film, the Ga/(Ga+In) atomic ratio is 0.001 to 0.12, and the percentage of indium and gallium with respect to the total metal atoms is 80 at % or more. The oxide thin film has an $In_2O_3$ bixbyite structure. An oxide sintered body is proposed as the material of the oxide thin film in which gallium is dissolved in indium oxide. In the oxide sintered body, the Ga/(Ga+In) atomic ratio is 0.001 to 0.12, and the percentage of indium and gallium with respect to the total metal atoms is 80 at % or more. The oxide sintered body has an $In_2O_3$ bixbyite structure.

However, there is still a problem in that the carrier density described in Examples 1 to 8 in Patent Document 2 is of the order of $10^{18}$ $cm^{-3}$, which is too high for an oxide semiconductor thin film to be used in TFTs.

Patent Document 3 discloses an oxide sintered body having a bixbyite structure and containing indium oxide, gallium oxide, and zinc oxide. The quantitative ratio of zinc to indium, gallium, and zinc is more than 0.05 and less than 0.65 in terms of atomic ratio However, in most of sintered bodies in Examples described in Patent Document 3, the zinc content ratio is as high as more than 0.10. Thin films, when formed by using the sintered bodies, have a high crystallization temperature, which causes a problem associated with difficulty obtaining a crystalline film having a bixbyite structure and having stable properties as a thin film transistor.

Patent Document 1: Japanese Unexamined Patent Application, Publication No. 2010-219538

Patent Document 2: PCT International Publication No. WO2010/032422

Patent Document 3: PCT International Publication No. WO2009/148154

DISCLOSURE OF THE INVENTION

Problems to be Solved by the Invention

An object of the present invention is to provide a sputtering target that allows a crystalline oxide semiconductor thin film to have low carrier density, an oxide sintered body most suitable for obtaining the sputtering target, and an oxide semiconductor thin film that is obtained by using the sputtering target and has low carrier density and high carrier mobility.

Means for Solving the Problems

The inventors of the present invention have newly found that an oxide semiconductor thin film formed as described below has low carrier density. The oxide semiconductor thin film is formed by using an oxide sintered body obtained as follows: adding a small amount of zinc to an oxide sintered body containing gallium as an oxide so that the Ga/(In+Ga) ratio is 0.08 or more and less than 0.20; and sintering the oxide sintered body. Specifically, the amount of zinc added is 0.0001 or more and less than 0.08 in terms of Zn/(In+Ga+Zn) ratio.

That is, in a first embodiment of the present invention, an oxide sintered body includes indium, gallium, and zinc as oxides. The gallium content is 0.08 or more and less than 0.20 in terms of Ga/(In+Ga) atomic ratio. The zinc content is 0.0001 or more and less than 0.08 in terms of Zn/(In+Ga+Zn) atomic ratio.

In a second embodiment of the present invention, the zinc content is 0.01 or more and 0.05 or less in terms of Zn/(In+Ga+Zn) atomic ratio in the oxide sintered body according to the first embodiment.

In a third embodiment of the present invention, the gallium content is 0.08 or more and 0.15 or less in terms of Ga/(In+Ga) atomic ratio in the oxide sintered body according to the first or second embodiment.

In a fourth embodiment of the present invention, the oxide sintered body according to any one of the first to third embodiments is substantially free of positive divalent elements other than zinc and positive trivalent to positive hexavalent elements other than indium and gallium.

In a fifth embodiment of the present invention, the oxide sintered body according to any one of the first to fourth embodiments includes an $In_2O_3$ phase having a bixbyite-type structure and a formed phase other than the $In_2O_3$ phase, the formed phase being selected from the group consisting of: a $GaInO_3$ phase having a $\beta$-$Ga_2O_3$-type structure; a $GaInO_3$ phase having a $\beta$-$Ga_2O_3$-type structure and a $(Ga, In)_2O_3$ phase; a $GaInO_3$ phase having a $\beta$-$Ga_2O_3$-type structure and an $In_2Ga_2ZnO_7$ phase having a $Yb_2Fe_3O_7$-type structure; a $(Ga, In)_2O_3$ phase and an $In_2Ga_2ZnO_7$ phase having a $Yb_2Fe_3O_7$-type structure; and a $GaInO_3$ phase having a $\beta$-$Ga_2O_3$-type structure, a $(Ga, In)_2O_3$ phase, and an $In_2Ga_2ZnO_7$ phase having a $Yb_2Fe_3O_7$-type structure.

In a sixth embodiment of the present invention, an X-ray diffraction peak intensity ratio of the $In_2Ga_2ZnO_7$ phase having a $Yb_2Fe_3O_7$-type structure defined by formula 1 below is in the range of 43% or less in the oxide sintered body according to the fifth embodiment:

$$100 \times I[In_2Ga_2ZnO_7 \text{ phase } (0010)]/\{I[In_2O_3 \text{ phase } (400)] + I[In_2Ga_2ZnO_7 \text{ phase } (0010)]\}[\%] \quad \text{Formula 1}$$

(wherein I [$In_2O_3$ phase (400)] represents a (400) peak intensity of the $In_2O_3$ phase having a bixbyite-type structure, and I [$In_2Ga_2ZnO_7$ phase (0010)] represents a (0010) peak intensity of the $In_2Ga_2ZnO_7$ phase having a $Yb_2Fe_3O_7$-type structure.)

In a seventh embodiment of the present invention, a sputtering target is obtained by machining the oxide sintered body according to any one of the first to sixth embodiments.

In an eighth embodiment of the present invention, a crystalline oxide semiconductor thin film is obtained by forming a film on a substrate by sputtering using the sputtering target according to the seventh embodiment, followed by crystallization by heating in an oxidizing atmosphere.

In a ninth embodiment of the present invention, the oxide semiconductor thin film according to the eighth embodiment has a carrier mobility of 10 $cm^2/V \cdot s$ or more.

In a tenth embodiment of the present invention, the oxide semiconductor thin film according to the eighth embodiment has a carrier mobility of 15 $cm^2/V \cdot s$ or more.

In an eleventh embodiment of the present invention, the oxide semiconductor thin film according to the eighth to tenth embodiments has a carrier density of $8.0 \times 10^{17} cm^3$ or less.

Effects of the Invention

An oxide sintered body of the present invention that contains indium and gallium as oxides and further contains zinc so that the Zn/(In+Ga+Zn) atomic ratio is 0.0001 or more and less than 0.08 can provide a crystalline oxide semiconductor thin film of the present invention by sputter deposition and subsequent heating, for example, when the oxide sintered body is used as a sputtering target. The crystalline oxide semiconductor thin film has a bixbyite structure. The presence of a predetermined amount of zinc provides an effect of reducing carrier density. When the crystalline oxide semiconductor thin film of the present invention is used in TFTs, the on/off ratio of TFTs can be increased. Therefore, the oxide sintered body, the target, and the oxide semiconductor thin film obtained by using the target in the present invention are industrially very useful.

PREFERRED MODE FOR CARRYING OUT THE INVENTION

An oxide sintered body, a sputtering target, and an oxide semiconductor thin film obtained by using the target in the present invention will be described below in detail.

An oxide sintered body of the present invention contains indium, gallium, and zinc as oxides. In the oxide sintered body, the gallium content is 0.08 or more and less than 0.20 in terms of Ga/(In+Ga) atomic ratio, and the zinc content is 0.0001 or more and less than 0.08 in terms of Zn/(In+Ga+Zn) atomic ratio.

The gallium content, in terms of Ga/(In+Ga) atomic ratio, is 0.08 or more and less than 0.20 and more preferably 0.08 or more and 0.15 or less. Gallium has an effect of reducing the oxygen loss in the crystalline oxide semiconductor thin film of the present invention because gallium has high bonding strength to oxygen. When the gallium content is less than 0.08 in terms of Ga/(In+Ga) atomic ratio, this effect is not sufficiently obtained. When the gallium content is 0.20 or more, the crystallization temperature is too high. Thus, the crystallinity cannot be increased in the temperature range regarded as preferable for semiconductor processing, and the carrier mobility is not high enough as an oxide semiconductor thin film. In order to ensure particularly preferable carrier mobility of the oxide semiconductor thin film, the gallium content is preferably 0.08 or more and 0.10 or less.

The oxide sintered body of the present invention contains zinc in addition to indium and gallium in the composition ranges defined above. The zinc concentration, in terms of Zn/(In+Ga+Zn) atomic ratio, is 0.0001 or more and less than 0.08. In order to ensure both preferable carrier density and preferable carrier mobility of the oxide semiconductor thin film, the zinc concentration is preferably 0.01 or more and 0.05 or less. In order to ensure particularly preferable carrier mobility of the oxide semiconductor thin film, the zinc concentration is preferably 0.0001 or more and 0.01 or less.

Doping the oxide sintered body of the present invention with zinc in this range reduces the carrier density because zinc doping has an effect of neutralizing electrons generated mainly by oxygen defects. When the crystalline oxide semiconductor thin film of the present invention is used in TFTs, the on/off ratio of TFTs can be increased.

It is preferred that the oxide sintered body of the present invention be substantially free of elements M, which are positive divalent elements other than zinc and positive trivalent to positive hexavalent elements other than indium and gallium. The term "substantially free of elements M" as used herein means that the content of each element M, in terms of M/(In+Ga+M) atomic ratio, is 500 ppm or less, preferably 200 ppm or less, and more preferably 100 ppm or less. Specific examples of the element M include positive divalent elements, such as Mg, Ni, Co, Cu, Ca, Sr, and Pb;

positive trivalent elements, such as Al, Y, Sc, B, and lanthanoids; positive tetravalent elements, such as Sn, Ge, Ti, Si, Zr, Hf, C, and Ce; positive pentavalent elements, such as Nb and Ta; and positive hexavalent elements, such as W and Mo.

1. Structure of Oxide Sintered Body

The oxide sintered body of the present invention is preferably composed mainly of an $In_2O_3$ phase having a bixbyite-type structure and a $GaInO_3$ phase having a $\beta$-$Ga_2O_3$-type structure. It is preferred that gallium be dissolved in the $In_2O_3$ phase, or gallium make up the $GaInO_3$ phase. When gallium is dissolved in the $In_2O_3$ phase, gallium substitutes for indium, which is a trivalent cation, at the lattice positions. It is not preferred that gallium be less dissolved in the $In_2O_3$ phase, or that the $GaInO_3$ phase having a $\beta$-$Ga_2O_3$-type structure be unlikely to be formed because of unsuccessful sintering or the like, and as a result, a $Ga_2O_3$ phase having a $\beta$-$Ga_2O_3$-type structure is formed. Since the $Ga_2O_3$ phase has low conductivity, abnormal discharge arises.

The oxide sintered body of the present invention is composed mainly of an $In_2O_3$ phase having a bixbyite-type structure. When the gallium content is 0.08 or more in terms of Ga/(In+Ga) atomic ratio, and the zinc content is 0.0001 or more in terms of Zn/(In+Ga+Zn) atomic ratio as in the present invention, the oxide sintered body includes, in addition to the $In_2O_3$ phase, a $GaInO_3$ phase having a $\beta$-$Ga_2O_3$-type structure only or both a $GaInO_3$ phase having a $\beta$-$Ga_2O_3$-type structure and a $(Ga, In)_2O_3$ phase.

The oxide sintered body of the present invention may include an $In_2Ga_2ZnO_7$ phase having a $Yb_2Fe_3O_7$-type structure. Preferably, the X-ray diffraction peak intensity ratio defined by formula 1 below is in the range of 43% or less.

$$100 \times I[In_2Ga_2ZnO_7 \text{ phase } (0010)]/\{I[In_2O_3 \text{ phase } (400)]+I[In_2Ga_2ZnO_7 \text{ phase } (0010)]\}[\%] \quad \text{Formula 1}$$

(wherein I [$In_2O_3$ phase (400)] represents a (400) peak intensity of the $In_2O_3$ phase having a bixbyite-type structure, and [$In_2Ga_2ZnO_7$ phase (0010)] represents a (0010) peak intensity of the $In_2Ga_2ZnO_7$ phase having a $Yb_2Fe_3O_7$-type structure.)

The oxide sintered body of the present invention may include an $In_2Ga_2ZnO_7$ phase having a $Yb_2Fe_3O_7$-type structure. When the sintered body includes two phases of the $In_2O_3$ phase and the $In_2Ga_2ZnO_7$ phase, the sintered body is not preferred because of low carrier mobility. When the oxide sintered body includes the $In_2Ga_2ZnO_7$ phase having a $Yb_2Fe_3O_7$-type structure and further includes the $GaInO_3$ phase having a $\beta$-$Ga_2O_3$-type structure, or the $(Ga, In)_2O_3$ phase, or both of the $GaInO_3$ phase having a $\beta$-$Ga_2O_3$-type structure and the $(Ga, In)_2O_3$ phase, the oxide sintered body is preferred because of high carrier mobility.

The oxide sintered body of the present invention is preferably substantially free of compounds having a homologous structure. The term "homologous structure" as used herein refers to a hexagonal crystal-based layered structure represented by the composition formula of $InGaO_3(ZnO)_m$ (m is a natural number from 2 to 20) for an oxide containing In, Ga, and Zn. For example, $InGaZnO_4$, where m=1, has a structure in which an $InO_2$ layer and a $(Ga, Zn)O$ layer are repeated in the c-axis direction. The presence of these layers can be determined by X-ray diffraction measurement. When the oxide sintered body is substantially free of compounds having a homologous structure in the present invention, it is advantageous in that the obtained crystalline oxide semiconductor thin film includes a bixbyite-type structure and has high carrier mobility. The term "substantially free of compounds having a homologous structure" means that the weight ratio, which is obtained by, for example, Rietveld analysis, of a phase formed from homologous compounds (hereinafter may be referred to as a homologous phase) to all phases in the oxide sintered body of the present invention is 8% or less, preferably 5% or less, more preferably 3% or less, still more preferably 1% or less, and yet still more preferably 0%.

2. Method for Producing Oxide Sintered Body

To produce the oxide sintered body of the present invention, a zinc oxide powder and an oxide powder composed of an indium oxide powder and a gallium oxide powder are used as raw material powders.

In the process for producing the oxide sintered body of the present invention, these raw material powders are mixed and then compacted, and the compact is sintered by ordinary-pressure sintering. The formed phases in the structure of the oxide sintered body of the present invention strongly depend on the conditions in each step for producing the oxide sintered body, for example, the particle size of the raw material powders, the mixing conditions, and the sintering conditions.

The structure of the oxide sintered body of the present invention is preferably composed mainly of an $In_2O_3$ phase having a bixbyite-type structure and a $GaInO_3$ phase having a $\beta$-$Ga_2O_3$-type structure. The mean particle size of each raw material powder is preferably 3.0 µm or less, more preferably 1.5 µm or less, and still more preferably 1.0 µm or less. As described above, when the gallium content is 0.08 or more in terms of Ga/(In+Ga) atomic ratio, the oxide sintered body includes, in addition to the $In_2O_3$ phase, the $GaInO_3$ phase having a $\beta$-$Ga_2O_3$-type structure or both the $GaInO_3$ phase having a $\beta$-$Ga_2O_3$-type structure and the $(Ga, In)_2O_3$ phase. In order to suppress formation of these phases as much as possible, the mean particle size of the raw material powders is preferably 1.0 µm or less.

Indium oxide powder is a raw material for ITO (tin-doped indium oxide), and fine indium oxide powder having good sintering properties has been developed along with improvements in ITO. Since indium oxide powder has been continuously used in large quantities as a raw material for ITO, raw material powder having a mean particle size of 1.0 µm or less is available these days.

Zinc oxide powder is also a main raw material for AZO (aluminum-doped zinc oxide). For the same reason as with indium oxide powder, raw material powder having a mean particle size of 1.0 µm or less is available.

However, since the amount of gallium oxide powder used is still smaller than that of indium oxide powder used, it is difficult to obtain raw material powder having a mean particle size of 1.0 µm or less for gallium oxide powder. Therefore, when only coarse gallium oxide powder is available, the powder needs to be pulverized into particles having a mean particle size of 1.0 µm or less.

In the process for sintering the oxide sintered body of the present invention, ordinary-pressure sintering is preferably employed. Ordinary-pressure sintering is a simple and industrially advantageous method, and is also an economically preferable means.

When ordinary-pressure sintering is used, a compact is first produced as described above. Raw material powders are placed in a resin pot and mixed with a binder (for example, PVA) and the like by wet ball milling or the like. In addition to the $In_2O_3$ phase having a bixbyite-type structure, which mainly makes up the oxide sintered body of the present invention, the oxide sintered body may include the $GaInO_3$ phase having a β-Ga$_2$O$_3$-type structure or both the GaInO$_3$ phase having a β-Ga$_2$O$_3$-type structure and the (Ga, In)$_2$O$_3$ phase. In order to suppress formation of these phases as much as possible, the ball mill mixing is preferably performed for 18 hours or longer. In this case, hard ZrO$_2$ balls are used as mixing balls. After mixing, the slurry is taken out, filtered, dried, and granulated. Subsequently, the resultant granulated material is compacted under a pressure of about 9.8 MPa (0.1 ton/cm$^2$) to 294 MPa (3 ton/cm$^2$) by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. An excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering and as a result, densification of the sintered body does not proceed. If oxygen is free, indium oxide decomposes particularly at about 900° C. to 1000° C. to form metal indium, which makes it difficult to obtain a desired oxide sintered body.

The temperature range of ordinary-pressure sintering is preferably from 1200° C. to 1550° C., and more preferably from 1350° C. to 1450° C. The sintering time is preferably 10 to 30 hours, and more preferably 15 to 25 hours.

When the sintering temperature is in the above range, and the oxide powder composed of the indium oxide powder and gallium oxide powder, and the zinc oxide powder that are controlled to have a mean particle size of 1.0 μm or less are used as raw material powders, the oxide sintered body is composed mainly of an In$_2$O$_3$ phase having a bixbyite-type structure. In particular, when the gallium content is 0.08 or more in terms of Ga/(In+Ga) atomic ratio, the GaInO$_3$ phase having a β-Ga$_2$O$_3$-type structure tends to be formed. When the zinc content is less than 0.08 in terms of Zn/(In+Ga+Zn) atomic ratio, an oxide sintered body substantially free of compounds having a homologous structure tends to be obtained.

At a sintering temperature lower than 1300° C., the sintering reaction does not proceed well. At a sintering temperature higher than 1550° C., densification is unlikely to proceed while a member of the sintering furnace reacts with the oxide sintered body. As a result, a desired oxide sintered body is not obtained. In particular, when the gallium content is over 0.10 in terms of Ga/(In+Ga) atomic ratio, the sintering temperature is preferably 1450° C. or lower. This is because formation of the (Ga, In)$_2$O$_3$ phase may become significant in the temperature region of about 1500° C. A small amount of the (Ga, In)$_2$O$_3$ phase is acceptable, but a large amount of the (Ga, In)$_2$O$_3$ phase is not preferred because there are risks of reduced deposition rate and arcing.

The temperature elevation rate until the sintering temperature is reached is preferably in the range of 0.2 to 5° C./min in order to cause debinding without forming cracks in the sintered body. As long as the temperature elevation rate is this range, the temperature may be increased to the sintering temperature in a combination of different temperature elevation rates as desired. During the temperature elevation process, a particular temperature may be maintained for a certain time in order for debinding and sintering to proceed. After sintering, oxygen introduction is stopped before cooling. The temperature is preferably decreased to 1000° C. at a temperature drop rate in the range of preferably 0.2 to 5° C./min, and more preferably 0.2° C./min or more and 1° C./min or less.

3. Target

The target of the present invention is obtained by cutting the above oxide sintered body into a predetermined size. For use as a target, the surface of the oxide sintered body is further grinded and the oxide sintered body is bonded to a backing plate to provide a target. The target preferably has a flat shape, but may have a cylindrical shape. When a cylindrical target is used, it is preferred to suppress particle generation due to target rotation. The oxide sintered body is machined into, for example, a cylindrical shape to form a tablet. The tablet can be used for film deposition by vapor deposition or ion plating.

For use as a sputtering target, the density of the oxide sintered body of the present invention is preferably 6.3 g/cm$^3$ or more, and more preferably 6.7 g/cm$^3$ or more. When the density is less than 6.3 g/cm$^3$, nodules are formed during use in mass production. For use as a tablet for ion plating, the density of the oxide sintered body used in the present invention is preferably less than 6.3 g/cm$^3$, and more preferably 3.4 to 5.5 g/cm$^3$. In this case, the sintering temperature is preferably less than 1200° C.

4. Oxide Semiconductor Thin Film and Method for Depositing Oxide Semiconductor Thin Film The crystalline oxide semiconductor thin film of the present invention is mainly obtained as follows: once forming an amorphous oxide thin film on a substrate by sputtering using the sputtering target; and heating the amorphous oxide thin film.

The sputtering target is formed from the oxide sintered body of the present invention. The structure of the oxide sintered body, namely, the structure composed mainly of an In$_2$O$_3$ phase having a bixbyite-type structure and a GaInO$_3$ phase having a β-Ga$_2$O$_3$-type structure, is important. The reason that an amorphous oxide thin film is once formed in order to obtain the crystalline oxide semiconductor thin film of the present invention is to perform patterning by wet etching. In order to ensure good wet-etching properties, the oxide thin film needs to be a stable amorphous film. Being a stable amorphous film means the oxide thin film has a high crystallization temperature, which is related to the structure of the oxide sintered body. That is, when the oxide sintered body includes not only an In$_2$O$_3$ phase having a bixbyite-type structure but also a GaInO$_3$ phase having a β-Ga$_2$O$_3$-type structure as in the oxide sintered body of the present invention, the oxide thin film formed from this oxide sintered body has a high crystallization temperature, specifically, a crystallization temperature of 225° C. or higher. That is, the oxide thin film is a stable amorphous film. In contrast, when the oxide sintered body includes only an In$_2$O$_3$ phase having a bixbyite-type structure, the oxide thin film formed from this oxide sintered body has a crystallization temperature lower than 225° C. and loses amorphous properties because of generation of microcrystals or the like. As a result, the oxide thin film has poor wet-etching properties.

Ordinary sputtering is used in the process for forming the amorphous oxide thin film. In particular, direct current (DC) sputtering is industrially advantageous because the thermal effects are minimized during film deposition and high-rate deposition is achieved. To form the oxide semiconductor thin film of the present invention by direct current sputtering, a gas mixture of an inert gas and oxygen, particularly a gas mixture of argon and oxygen, is preferably used as a sputtering gas. Sputtering is preferably performed in a chamber of a sputtering apparatus at an internal pressure of 0.1 to 1 Pa, particularly 0.2 to 0.8 Pa.

The substrate is typically a glass substrate and is preferably an alkali-free glass substrate. In addition, any resin sheet and resin film that withstands the above process conditions can be used.

In the process for forming the amorphous oxide thin film, presputtering can be performed as follows: for example, after evacuation to $2\times10^{-4}$ Pa or less, introducing a gas mixture of argon and oxygen until the gas pressure reaches 0.2 to 0.8 Pa; and generating a direct current plasma by applying direct current power so that the direct current power with respect to the area of the target, namely, the direct current power density, is in the range of about 1 to 7 W/cm$^2$. It is preferred that, after this presputtering for 5 to 30 minutes, the substrate position be corrected as desired and then sputtering be performed.

In sputter deposition in the process for forming the amorphous oxide thin film, the direct current power applied is increased in order to improve the deposition rate.

The crystalline oxide semiconductor thin film of the present invention is obtained by forming the amorphous thin film and crystallizing the amorphous thin film. The crystallization method involves: for example, once forming an amorphous film at a low temperature, for example, near room temperature; and then crystallizing the oxide thin film by performing heating at the crystallization temperature or higher, or heating a substrate to the crystallization temperature of the oxide thin film or higher to form a crystalline oxide semiconductor thin film. The heating temperature in these two methods is only about 500° C. or lower, and an alkali-free glass substrate can be used.

The proportion of indium, gallium, and zinc in the amorphous oxide thin film and the crystalline oxide semiconductor thin film substantially corresponds to the composition of the oxide sintered body of the present invention. That is, the crystalline oxide semiconductor thin film contains indium and gallium as oxides and further contains zinc. The gallium content is 0.08 or more and less than 0.20 in terms of Ga/(In+Ga) atomic ratio. The zinc content is 0.0001 or more and less than 0.08 in terms of Zn/(In+Ga+Zn) atomic ratio.

The crystalline oxide semiconductor thin film of the present invention preferably includes only an $In_2O_3$ phase having a bixbyite structure. In the $In_2O_3$ phase, gallium or zinc is dissolved to substitute for indium, which is a trivalent cation, at the lattice positions, and zinc is dissolved to substitute, as in the oxide sintered body. In the oxide semiconductor thin film of the present invention, the carrier density decreases to $8.0\times10^{17}$ cm$^{-3}$ or less because zinc doping has an effect of neutralizing carrier electrons generated mainly by oxygen defects. In this case, the carrier mobility is 10 cm$^2$/V·s or more, preferably 15 cm$^2$/V·s or more, and particularly preferably 20 cm$^2$/V·s or more.

The crystalline oxide semiconductor thin film of the present invention is subjected to micromachining, which is required in applications such as TFTs, by wet etching or dry etching. When an amorphous film is once formed at an appropriate substrate temperature selected from temperatures lower than the crystallization temperature, for example, temperatures from room temperature to 300° C., and then the oxide thin film is crystallized by performing heating at a temperature of the crystallization temperature or higher, micromachining can be performed by wet etching using a weak acid after the amorphous film formation. Most weak acids can be used, but a weak acid composed mainly of oxalic acid is preferably used. For example, ITO-06N available from Kanto Chemical Co., Inc., or the like can be used. When the crystalline oxide semiconductor thin film is formed by heating the substrate at the crystallization temperature of the oxide thin film or higher, for example, wet etching or dry etching with a strong acid such as aqueous ferric chloride can be employed, and dry etching is preferably employed from the standpoint of damage to the surrounding area of a TFT.

Although the thickness of the crystalline oxide semiconductor thin film of the present invention is not limited, the thickness is 10 to 500 nm, preferably 20 to 300 nm, and more preferably 30 to 100 nm. When the thickness is less than 10 nm, unfavorable crystallinity is obtained, and as a result, high carrier mobility is not achieved. When the thickness is more than 500 nm, it is disadvantageous in that a problem associated with productivity arises.

The mean transmittance of the crystalline oxide semiconductor thin film of the present invention in the visible range (400 to 800 nm) is preferably 80% or more, more preferably 85% or more, and still more preferably 90% or more. When the crystalline oxide semiconductor thin film of the present invention is used in a transparent TFT and the mean transmittance is less than 80%, the light extraction efficiency of, for example, liquid crystal elements and organic EL elements as transparent display devices decreases.

The light absorption by the crystalline oxide semiconductor thin film of the present invention is low in the visible range, and the transmittance of light through the crystalline oxide semiconductor thin film is high. The a-IGZO film described in Patent Document 1 contains a large amount of zinc, and thus the light absorption by the a-IGZO film is large particularly at the shorter wavelength side in the visible range. In contrast, the crystalline oxide semiconductor thin film of the present invention contains only a small amount of zinc, and thus the light absorption at the shorter wavelength side in the visible range is small. For example, the extinction coefficient at a wavelength of 400 nm is 0.05 or less. Therefore, the transmittance of blue light near a wavelength of 400 nm is high, which increases color development of, for example, liquid crystal elements and organic EL elements. Because of this reason, the crystalline oxide semiconductor thin film of the present invention is suitable for, for example, a material for a channel layer in TFTs.

EXAMPLES

A more detailed description is provided below by way of Examples of the present invention, but the present invention is not limited by these Examples.

<Evaluation of Oxide Sintered Body>

The proportion of metal elements in the obtained oxide sintered body was determined by ICP emission spectrometry. The formed phases were identified by a powder method with an X-ray diffractometer (available from Philips) using rejects of the obtained oxide sintered body.

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and mobility of the oxide thin film were determined with a Hall-effect measurement apparatus (available from TOYO Corporation). The formed phases in the film were identified by X-ray diffraction measurement.

Preparation Example

An indium oxide powder, a gallium oxide powder, and a zinc oxide powder were prepared as raw material powders so that each powder has a mean particle size of 1.0 μm or less. These raw material powders were prepared so as to obtain the Ga/(In+Ga) atomic ratio and the Zn/(In+Ga+Zn) atomic ratio of Examples and Comparative Examples shown in Table 1. The raw material powders were placed in a resin pot together with water and mixed by wet ball milling. In this case, hard $ZrO_2$ balls were used, and the mixing time was 18 hours. After mixing, the slurry was taken out, filtered, dried, and granulated. The granulated material was compacted by cold isostatic pressing under a pressure of 3 ton/cm².

Next, the compact was sintered as described below. The compact was sintered at a sintering temperature of between 1350 and 1450° C. for 20 hours in an atmosphere obtained by introducing oxygen into air in a sintering furnace at a rate of 5 L/min per 0.1 m³ furnace volume. At this time, the temperature was increased by 1° C./min, oxygen introduction was stopped during cooling after sintering, and the temperature was decreased to 1000° C. by 1° C./min.

The composition of the obtained oxide sintered body was analyzed by ICP emission spectrometry. As a result, it was confirmed that the proportion of the metal elements substantially corresponds to the composition prepared at the time of mixing raw material powders in all Examples.

Next, the phases of the oxide sintered body were identified by X-ray diffraction measurement. When the oxide sintered body includes an $In_2Ga_2ZnO_7$ phase having a $Yb_2Fe_3O_7$-type structure, the X-ray diffraction peak intensity ratio of the $In_2Ga_2ZnO_7$ phase having a $Yb_2Fe_3O_7$-type structure defined by formula 1 below is shown in Table 1.

$$100 \times I[In_2Ga_2ZnO_7 \text{ phase } (0010)]/\{I[In_2O_3 \text{ phase } (400)] + I[In_2Ga_2ZnO_7 \text{ phase } (0010)]\} [\%] \quad \text{Formula 1}$$

(wherein I [$In_2O_3$ phase (400)] represents a (400) peak intensity of the $In_2O_3$ phase having a bixbyite-type structure, and [$In_2Ga_2ZnO_7$ phase (0010)] represents a (0010) peak intensity of the $In_2Ga_2ZnO_7$ phase having a $Yb_2Fe_3O_7$-type structure.)

TABLE 1

| | Ga/(In + Ga) Atomic ratio | Zn/(In + Ga + Zn) Atomic ratio | Sintering temperature (° C.) | Density of sintered body (g/cm³) | $In_2Ga_2ZnO_7$ (0010) Peak intensity ratio | Crystal structure of sintered body |
|---|---|---|---|---|---|---|
| Comparative Example 1 | 0.05 | 0.01 | 1400 | 7.05 | 0 | Only $In_2O_3$ |
| Comparative Example 2 | 0.08 | 0 | 1450 | 7.00 | 0 | Only $In_2O_3$ |
| Comparative Example 3 | 0.08 | 0.00005 | 1450 | 7.02 | 0 | Only $In_2O_3$ |
| Example 1 | 0.08 | 0.0001 | 1400 | 7.03 | 0 | $In_2O_3/GaInO_3$ |
| Example 2 | 0.08 | 0.01 | 1400 | 7.02 | 0 | $In_2O_3/GaInO_3/(Ga, In)_2O_3$ |
| Example 3 | 0.08 | 0.04 | 1400 | 7.00 | 22 | $In_2O_3/GaInO_3/In_2Ga_2ZnO_7$ |
| Comparative Example 4 | 0.08 | 0.08 | 1350 | 6.92 | 60 | $In_2O_3/In_2Ga_2ZnO_7$ |
| Example 4 | 0.1 | 0.0001 | 1400 | 7.02 | 0 | $In_2O_3/GaInO_3/(Ga, In)_2O_3$ |
| Example 5 | 0.1 | 0.01 | 1400 | 7.01 | 0 | $In_2O_3/GaInO_3$ |
| Comparative Example 5 | 0.15 | 0.00005 | 1450 | 6.95 | 0 | $In_2O_3/GaInO_3$ |
| Example 6 | 0.15 | 0.0001 | 1400 | 6.93 | 0 | $In_2O_3/GaInO_3$ |
| Example 7 | 0.15 | 0.01 | 1400 | 6.92 | 0 | $In_2O_3/GaInO_3/(Ga, In)_2O_3$ |
| Example 8 | 0.15 | 0.04 | 1400 | 6.90 | 0 | $In_2O_3/GaInO_3/(Ga, In)_2O_3$ |
| Example 9 | 0.15 | 0.05 | 1400 | 6.91 | 0 | $In_2O_3/GaInO_3/(Ga, In)_2O_3$ |
| Example 10 | 0.15 | 0.07 | 1400 | 6.90 | 28 | $In_2O_3/GaInO_3/In_2Ga_2ZnO_7$ |
| Comparative Example 6 | 0.15 | 0.08 | 1350 | 6.91 | 63 | $In_2O_3/In_2Ga_2ZnO_7$ |
| Example 11 | 0.18 | 0.0001 | 1400 | 6.93 | 0 | $In_2O_3/GaInO_3$ |
| Example 12 | 0.18 | 0.01 | 1400 | 6.91 | 0 | $In_2O_3/GaInO_3/(Ga, In)_2O_3$ |
| Example 13 | 0.18 | 0.05 | 1400 | 6.90 | 0 | $In_2O_3/GaInO_3/(Ga, In)_2O_3$ |
| Example 14 | 0.18 | 0.07 | 1400 | 6.90 | 43 | $In_2O_3/GaInO_3/In_2Ga_2ZnO_7$ |
| Comparative Example 7 | 0.18 | 0.08 | 1350 | 6.87 | 66 | $In_2O_3/In_2Ga_2ZnO_7$ |
| Comparative Example 8 | 0.2 | 0.04 | 1400 | 6.85 | 0 | $In_2O_3/GaInO_3/(Ga, In)_2O_3$ |

The oxide sintered body was machined to a size of 152 mm in diameter and 5 mm in thickness. The sputtering surface was grinded with a cup grinding wheel so that the maximum height Rz was 3.0 μm or less. The machined oxide sintered body was bonded to an oxygen-free copper backing plate by using metal indium to provide a sputtering target.

Film deposition by direct current sputtering was performed at the substrate temperatures described in Table 2 by using the sputtering targets of Examples and Comparative Examples and an alkali-free glass substrate (Corning Eagle XG). The sputtering target was attached to a cathode of a direct current magnetron sputtering apparatus (available from Tokki Corporation) having a direct current power supply with no arcing control function. At this time, the target-substrate (holder) distance was fixed at 60 mm. After evacuation to $2\times10^{-4}$ Pa or less, a gas mixture of argon and oxygen was introduced at an appropriate oxygen ratio, which depends on the gallium content and zinc content in the target. The gas pressure was controlled to 0.6 Pa. A direct current plasma was generated by applying a direct current power of 300 W (1.64 W/cm$^2$). After presputtering for 10 minutes, the substrate was placed directly above the sputtering target, namely, in the stationary opposing position, and an oxide thin film having a thickness of 50 nm was deposited. The composition of the obtained oxide thin film was confirmed to be substantially the same as that of the target. As a result of X-ray diffraction measurement, the oxide thin film was confirmed to be amorphous. The obtained amorphous oxide thin film was heated at between 300 to 500° C. for 30 minutes in air as described in Table 2. The crystallinity of the heated oxide thin film was examined by X-ray diffraction measurement. For crystallized oxide semiconductor thin films, the crystalline phases in the oxide semiconductor thin films were identified. The Hall-effect measurement was performed on the obtained oxide semiconductor thin films to obtain the carrier density and the carrier mobility. The obtained evaluation results are summarized in Table 2.

TABLE 2

|  | Substrate temperature (° C.) | Heat treatment temperature (° C.) | Film thickness (nm) | Crystal structure of thin film | Carrier density ($\times10^{17}$cm$^{-3}$) | Carrier mobility (cm$^2$/V·s) |
|---|---|---|---|---|---|---|
| Comparative Example 1 | Room temperature | 300 | 50 | Only In$_2$O$_3$ | 11 | 23.4 |
| Comparative Example 2 | Room temperature | 300 | 50 | Only In$_2$O$_3$ | 14 | 23.4 |
| Comparative Example 3 | Room temperature | 300 | 50 | Only In$_2$O$_3$ | 16 | 22.9 |
| Example 1 | Room temperature | 300 | 50 | Only In$_2$O$_3$ | 7.9 | 22.3 |
| Example 2 | Room temperature | 350 | 50 | Only In$_2$O$_3$ | 5.0 | 21.1 |
| Example 3 | Room temperature | 450 | 50 | Only In$_2$O$_3$ | 0.34 | 17.1 |
| Comparative Example 4 | Room temperature | 500 | 50 | Amorphous | 52 | 24.9 |
| Example 4 | Room temperature | 325 | 50 | Only In$_2$O$_3$ | 7.2 | 21.8 |
| Example 5 | Room temperature | 400 | 50 | Only In$_2$O$_3$ | 1.2 | 20.4 |
| Comparative Example 5 | Room temperature | 350 | 50 | Only In$_2$O$_3$ | 9.9 | 18.8 |
| Example 6 | Room temperature | 375 | 50 | Only In$_2$O$_3$ | 6.2 | 18 |
| Example 7 | Room temperature | 400 | 50 | Only In$_2$O$_3$ | 4.1 | 18.1 |
| Example 8 | Room temperature | 450 | 50 | Only In$_2$O$_3$ | 0.84 | 16.2 |
| Example 9 | Room temperature | 450 | 50 | Only In$_2$O$_3$ | 0.39 | 15.3 |
| Example 10 | Room temperature | 500 | 50 | Only In$_2$O$_3$ | 0.14 | 11.6 |
| Comparative Example 6 | Room temperature | 500 | 50 | Amorphous | 49 | 22.0 |
| Example 11 | Room temperature | 400 | 50 | Only In$_2$O$_3$ | 5.3 | 17.2 |
| Example 12 | Room temperature | 450 | 50 | Only In$_2$O$_3$ | 4.6 | 16.9 |
| Example 13 | Room temperature | 500 | 50 | Only In$_2$O$_3$ | 0.32 | 15.0 |
| Example 14 | Room temperature | 500 | 50 | Only In$_2$O$_3$ | 0.24 | 13.8 |
| Comparative Example 7 | Room temperature | 500 | 50 | Amorphous | 43 | 21.1 |
| Comparative Example 8 | Room temperature | 500 | 50 | Amorphous | 42 | 19.3 |

[Evaluation]

The results in Table 1 indicate that, when the gallium content is 0.08 or more and less than 0.20 in terms of Ga/(In+Ga) atomic ratio and the zinc content is 0.0001 or more and less than 0.08 in terms of Zn/(In+Ga+Zn) atomic ratio in Examples 1 to 14, the oxide semiconductor thin films included: an In$_2$O$_3$ phase having a bixbyite-type structure and a GaInO$_3$ phase; an In$_2$O$_3$ phase having a bixbyite-type structure, a GaInO$_3$ phase having a β-Ga$_2$O$_3$-type structure, and a (Ga, In)$_2$O$_3$ phase; or an In$_2$O$_3$ phase having a bixbyite-type structure, a GaInO$_3$ phase having a β-Ga$_2$O$_3$-type structure, and an In$_2$Ga$_2$ZnO$_7$ phase having a Yb$_2$Fe$_3$O$_7$-type structure.

In contrast, in Comparative Examples 1 to 3 and 5, the gallium and/or zinc content in the oxide sintered body is below the range of the present invention. In Comparative Examples 1 to 3, the oxide sintered body accordingly contains only the In$_2$O$_3$ phase having a bixbyite-type structure. In Comparative Examples 4, 6, and 7, the zinc content is excessive and thus the X-ray diffraction peak intensity ratio of the In$_2$Ga$_2$ZnO$_7$ phase having a Yb$_2$Fe$_3$O$_7$-type structure is over 43%. As a result, a desired oxide sintered body of the present invention is not obtained.

The results of Table 2 also indicate that, the crystalline oxide semiconductor thin films contain indium, gallium, and zinc as oxides. The properties of the oxide semiconductor thin films are controlled so that the gallium content is 0.08 or more and less than 0.20 in terms of Ga/(In+Ga) atomic ratio and the zinc content is 0.0001 or more and less than 0.08 in terms of Zn/(In+Ga+Zn) atomic ratio.

The oxide semiconductor thin films of Examples are all found to include only the In$_2$O$_3$ phase having a bixbyite-type structure. The oxide semiconductor thin films of Examples have a carrier density of $8.0 \times 10^{17}$ cm$^3$ or less and a carrier mobility of 10 cm$^2$/V·s or more. In particular, the oxide semiconductor thin films of Examples 2, 3, 5, and 7 to 9 in which the gallium content is 0.08 or more and 0.15 or less in terms of Ga/(In+Ga) atomic ratio and the zinc content is 0.001 or more and 0.05 or less in terms of Zn/(In+Ga+Zn) atomic ratio are found to have good carrier properties, specifically, a carrier density of $5.0 \times 10^{17}$ cm$^3$ or less and a carrier mobility of 15 cm$^2$/V·s or more.

When the gallium content is 0.08 or more and 0.10 or less in terms of Ga/(In+Ga) atomic ratio and the zinc content is 0.0001 or more and 0.01 or less in terms of Zn/(In+Ga+Zn) atomic ratio, the oxide semiconductor thin films as in Examples 1, 2, 4, and 5 are found to have particularly preferable carrier mobility, specifically a carrier mobility of 20 cm$^2$/V·s or more.

In contrast, in Comparative Examples 1 to 8, the gallium content expressed as the Ga/(In+Ga) atomic ratio or the zinc content expressed as the Zn/(In+Ga+Zn) atomic ratio is out of the range of the present invention. As a result, the carrier density is found to be over $8.0 \times 10^{17}$ cm$^{-3}$. The oxide thin films of Comparative Examples 4, 6, 7, and 8 are not crystallized even by performing heating in air at 500° C., and the carrier density thereof is found to be over $8.0 \times 10^{17}$ cm$^{-3}$.

The invention claimed is:

1. An oxide sintered body comprising indium, gallium, and zinc as oxides, wherein
   a gallium content is 0.08 or more and less than 0.20 in terms of Ga/(In+Ga) atomic ratio, and
   a zinc content is 0.0001 or more and less than 0.08 in terms of Zn/(In+Ga+Zn) atomic ratio,
   wherein the oxide sintered body comprises an In$_2$O$_3$ phase having a bixbyite-type structure and a formed phase other than the In$_2$O$_3$ phase, the formed phase being selected from the group consisting of: a GaInO$_3$ phase having a β-Ga$_2$O$_3$-type structure; a GaInO$_3$ phase having a β-Ga$_2$O$_3$-type structure and a (Ga, In)$_2$O$_3$ phase; a GaInO$_3$ phase having a β-Ga$_2$O$_3$-type structure and an In$_2$Ga$_2$ZnO$_7$ phase having an Yb$_2$Fe$_3$O$_7$-type structure; a (Ga, In)$_2$O$_3$ phase and an In$_2$Ga$_2$ZnO$_7$ phase having an Yb$_2$Fe$_3$O$_7$-type structure; and a GaInO$_3$ phase having a β-Ga$_2$O$_3$-type structure, a (Ga, In)$_2$O$_3$ phase, and an In$_2$Ga$_2$ZnO$_7$ phase having an Yb$_2$Fe$_3$O$_7$-type structure.

2. The oxide sintered body according to claim 1, wherein the zinc content is 0.01 or more and 0.05 or less in terms of Zn/(In+Ga+Zn) atomic ratio.

3. The oxide sintered body according to claim 1, wherein the gallium content is 0.08 or more and 0.15 or less in terms of Ga/(In+Ga) atomic ratio.

4. The oxide sintered body according to claim 1, wherein the oxide sintered body is substantially free of positive divalent elements other than zinc and positive trivalent to positive hexavalent elements other than indium and gallium.

5. The oxide sintered body according to claim 1, wherein an X-ray diffraction peak intensity ratio of the In$_2$Ga$_2$ZnO$_7$ phase having a Yb$_2$Fe$_3$O$_7$-type structure defined by formula 1 below is in the range of 43% or less:

$$100 \times I[\text{In}_2\text{Ga}_2\text{ZnO}_7 \text{ phase } (0010)]/\{I[\text{In}_2\text{O}_3 \text{ phase } (400)]+I[\text{In}_2\text{Ga}_2\text{ZnO}_7 \text{ phase } (0010)]\}[\%] \quad \text{Formula 1}$$

(wherein I [In$_2$O$_3$ phase (400)] represents a (400) peak intensity of the In$_2$O$_3$ phase having a bixbyite-type structure, and [In$_2$Ga$_2$ZnO$_7$ phase (0010)] represents a (0010) peak intensity of the In$_2$Ga$_2$ZnO$_7$ phase having a Yb$_2$Fe$_3$O$_7$-type structure).

6. A sputtering target obtained by machining the oxide sintered body according to claim 1.

7. A crystalline oxide semiconductor thin film obtained by forming an amorphous film on a substrate by sputtering using the sputtering target according to claim 6 and then crystallizing the amorphous film by heating in an oxidizing atmosphere.

8. The oxide semiconductor thin film according to claim 7, wherein the oxide semiconductor thin film has a carrier mobility of 10 cm$^2$/V·s or more.

9. The oxide semiconductor thin film according to claim 7, wherein the oxide semiconductor thin film has a carrier mobility of 15 cm$^2$/V·s or more.

10. The oxide semiconductor thin film according to claim 7, wherein the oxide semiconductor thin film has a carrier density of $8.0 \times 10^{17}$ cm$^{-3}$ or less.

* * * * *